United States Patent
Chu et al.

(10) Patent No.: US 12,287,365 B2
(45) Date of Patent: Apr. 29, 2025

(54) RADIO-FREQUENCY ELEMENT GROUP TESTING SYSTEM AND METHOD

(71) Applicant: OHMPLUS TECHNOLOGY INC., New Taipei (TW)

(72) Inventors: Chih-Yuan Chu, New Taipei (TW); Hsi-Tseng Chou, New Taipei (TW); Jake Waldvogel Liu, New Taipei (TW); Chih-Wei Chiu, New Taipei (TW)

(73) Assignee: Ohmplus Technology Inc., New Taipei (TW)

( * ) Notice: Subject to any disclaimer, the term of this patent is extended or adjusted under 35 U.S.C. 154(b) by 162 days.

(21) Appl. No.: 18/337,690

(22) Filed: Jun. 20, 2023

(65) Prior Publication Data

US 2023/0417822 A1 Dec. 28, 2023

Related U.S. Application Data

(60) Provisional application No. 63/366,858, filed on Jun. 23, 2022.

(51) Int. Cl.
*G01R 31/28* (2006.01)
*G01R 23/16* (2006.01)

(52) U.S. Cl.
CPC ......... *G01R 31/2822* (2013.01); *G01R 23/16* (2013.01)

(58) Field of Classification Search
CPC . G01R 31/2822; G01R 23/16; H04B 17/0085
USPC ........................................ 324/650, 649, 600
See application file for complete search history.

(56) References Cited

U.S. PATENT DOCUMENTS

| | | | |
|---|---|---|---|
| 9,210,598 B1* | 12/2015 | Bradley | H04B 17/23 |
| 2018/0088172 A1 | 3/2018 | Hantsch et al. | |
| 2019/0273564 A1* | 9/2019 | Vella-Coleiro | G01R 23/20 |
| 2022/0294542 A1* | 9/2022 | Song | G01R 27/04 |

FOREIGN PATENT DOCUMENTS

JP    H10209992 A    8/1998

OTHER PUBLICATIONS

Examination Report mailed to Corresponding Japanese Patent Application No. 2023-101353 dated Jun. 4, 2024.
Examination Report mailed to Corresponding Taiwanese Patent Application No. 112120400 dated Jul. 22, 2024.

* cited by examiner

*Primary Examiner* — Giovanni Astacio-Oquendo
(74) *Attorney, Agent, or Firm* — Rosenberg, Klein & Lee

(57) ABSTRACT

The present invention discloses an RF element group testing system and method. The method comprises steps: adding an identification feature to a first RF signal, which is output by one of the plurality of tested RF elements, to generate an identification RF signal; synthesizing the identification RF signal and a second RF signal, which is output by each of the rest of the tested RF elements, to generate a corresponding synthesis signal; resolving the synthesis signal into the identification RF signal and the corresponding second RF signal according to the identification feature; restoring the identification RF signal into the first RF signal; and calculating at least one signal-feature parameter of the first RF signal and the second RF signal.

8 Claims, 8 Drawing Sheets

```
┌─────────────────────────────────────┐
│ the power distributer receives the power │
│ signal; the first tested RF element outputs │
│ the first RF signal according to the power │
│ signal; the plurality of tested second RF │ ~ S301
│ elements respectively outputs the │
│ corresponding second RF signals │
│ according to the power signal │
└─────────────────────────────────────┘
                    │
                    ▼
┌─────────────────────────────────────┐
│ the phase shifter receives the first RF │
│ signal and adjusts the phase angle of the │
│ first RF signal to generate the │ ~ S302
│ identification RF signal │
└─────────────────────────────────────┘
                    │
                    ▼
┌─────────────────────────────────────┐
│ the signal switcher performs switching to │
│ connect each of the second sub-testing │
│ areas with the power synthesizer in │
│ sequence to respectively transmit the │
│ second RF signals output by the second │ ~ S303
│ tested RF elements to the power │
│ synthesizer │
└─────────────────────────────────────┘
                    │
                    ▼
┌─────────────────────────────────────┐
│ the power synthesizer receives the │
│ identification RF signal and each second │ ~ S304
│ RF signal to synthesizes them into the │
│ corresponding synthesis signal │
└─────────────────────────────────────┘
```

FIG. 9

RADIO-FREQUENCY ELEMENT GROUP TESTING SYSTEM AND METHOD

This application claims priority for the U.S. provisional patent application No. 63/366,858 filed on 23 Jun. 2022, the content of which is incorporated by reference in its entirely.

BACKGROUND OF THE INVENTION

Field of the Invention

The present invention relates to an radio-frequency (RF) element testing system and a method thereof, particularly to a RF element testing system able to test a plurality of RF elements simultaneously and a method thereof.

Description of the Prior Art

Refer to FIG. 1. The conventional RF element parallel testing system comprises a vector signal generator 1 (abbreviated as VSG), a testing platform 2, and a plurality of vector signal analyzers 3 (abbreviated as VSA). The testing platform 2 may accommodate a plurality of tested RF elements 20. The number of the vector signal analyzers 3 is equal to the number of the tested RF elements 20 placed in the testing platform 2. Each vector signal analyzer 3 only receives the RF signal output by one of the tested RF elements 20. The vector signal generator 1 inputs a power signal to each of the tested RF elements 20 in the testing platform 2; the tested RF elements 20 respectively output different RF signals; the tested RF elements 20 respectively transmit the RF signals to the vector signal analyzers 3; the vector analyzers 3 respectively analyze the corresponding RF signals to obtain at least one signal-feature parameter of each RF signal, such return loss or isolation.

It is learned from the above description: the conventional RF element parallel testing system can simultaneously test a plurality of tested RF elements, and each vector signal analyzer works out the signal-feature parameters of the corresponding RF signal. Therefore, the conventional RF element parallel testing system can fast complete the testing of tested RF elements in groups.

The conventional RF element parallel testing system needs the vector signal analyzers whose number is the same as the number of the tested RF elements. The more the RF elements tested by the conventional RF element parallel testing system, the more the vector signal analyzers are required. The vector signal analyzer is a very expensive instrument. Thus, the RF element testing company have to spend a lot of money in purchasing the vector signal analyzers. Suppose that a testing platform can test four RF elements simultaneously and that only three or less RF elements are tested simultaneously in each cycle of testing. Thus, some vector signal analyzers are idled, and the highest efficiency is unlikely to achieve. Accordingly, the number and usage of the vector signal analyzers has room to improve.

SUMMARY OF THE INVENTION

In order to solve the conventional problems, one objective of the present invention is to provide an RF element group testing system, which synthesizes the RF signals of a plurality of tested RF elements into synthesis signals and uses a single vector signal analyzer to resolve and calculate the synthesis signals, whereby to generate the signal-feature parameters of the tested RF elements.

According to the abovementioned objective, the present invention proposes an RF element group testing system, which comprises a signal generator, a testing platform, and a signal analysis unit. The testing platform is connected with the signal generator and the signal analysis unit. The testing platform accommodates a plurality of tested RF elements. The signal generator generates a power signal and transmits the power signal to each of the tested RF elements through the testing platform. One of the plurality of tested RF elements outputs a first RF signal. An identification feature is added to the first RF signal to generate an identification RF signal. The rest of the plurality of tested RF elements respectively output second RF signals. The identification RF signal is synthesized with each second RF signal to generate a corresponding synthesis signal in the testing platform. The signal analysis unit receives each synthesis signal. The signal analysis unit resolves each synthesis signal into the identification RF signal and one corresponding second RF signal according to the identification feature. The signal analysis unit restores the identification RF signal to obtain the first RF signal according to the identification feature. The signal analysis unit 6 further works out at least one signal-feature parameter from the first RF signal and each of the second RF signal.

In one embodiment, the plurality of tested RF elements includes a first tested RF element and a second tested RF element. The testing platform includes a power distributer, a first sub-testing area, a second sub-testing area, a phase shifter, and a power synthesizer. The power distributer is connected with the signal generator, the first sub-testing area, and the second sub-testing area. The phase shifter is connected with the first sub-testing area. The power synthesizer is connected with the phase shifter and the second sub-testing area. The power distributer distributes the power signal to the first sub-testing area and the second sub-testing area, whereby to make the first tested RF element placed in the first sub-testing area outputs the first RF signal according to the power signal and make the second tested RF element placed in the second sub-testing area output the second RF signal according to the power signal. The phase shifter receives the first RF signal and adjusts the phase angle of the first RF signal to generate the identification RF signal, wherein the adjusted phase angle of the first RF signal is the identification feature. The power synthesizer receives the identification RF signal and the second RF signal to generate the synthesis signal. The signal analysis unit is a signal analyzer connected with the power synthesizer.

In one embodiment, the plurality of tested RF elements is divided into a plurality of tested groups. Each tested group includes a first tested RF element and a second tested RF element. The testing platform includes a power distributer and a plurality of testing areas. Each testing area accommodates one of the plurality of tested groups. Each testing area is equivalent to the combination of the first sub-testing area and the second sub-testing area mentioned above, the phase shifter, and the power synthesizer. The signal analysis unit includes a plurality of signal analyzers. Each signal analyzer is connected with one of the power synthesizers.

In one embodiment, the plurality of tested RF elements includes a first tested RF element and a plurality of second tested RF elements. The testing platform includes a power distributer, a first sub-testing area, a plurality of second sub-testing areas, a phase shifter, a power synthesizer, and a signal switcher. The power distributer is connected with the signal generator, the first sub-testing area, and the plurality of second sub-testing area. The phase shifter is connected with the first sub-testing area. The plurality of second sub-testing areas is connected with the signal switcher. The power synthesizer is connected with the phase shifter and the signal switcher. The power distributer distributes the power signal to the first sub-testing area and the plurality of second sub-testing areas. The first tested RF element is accommodated by the first sub-testing area, generating the first RF signal according to the power signal. The plurality of second tested RF elements is respectively accommodated by the plurality of second sub-testing areas, each generating one corresponding second RF signal according to the power signals. The phase shifter receives the first RF signal and adjusts the phase angle of the first RF signal to generate the identification RF signal and then transmits the identification RF signal to the power synthesizer, wherein the adjusted phase angle of the first RF signal is exactly the identification feature. The signal switcher performs switching to connect each of the second sub-testing areas to the power synthesizer in sequence and outputs the second RF signal of the second sub-testing area, which is connected to the signal switcher in each cycle of switching, to the power synthesizer. The power synthesizer synthesizes the identification RF signal and each second RF signal to form one corresponding synthesis signal. The signal analysis unit is a signal analyzer connected with the power synthesizer.

In one embodiment, the plurality of tested RF elements is divided into a plurality of tested groups. Each tested group includes a first tested RF element and a plurality of second tested RF elements. The testing platform includes a power distributer and a plurality of testing areas. Each testing area accommodates one of the plurality of tested group. Each testing area is equivalent to the combination of the first sub-testing area and the plurality of second sub-testing areas mentioned above, the phase shifter, the power synthesizer, and the signal switcher. The signal analysis unit includes a plurality of signal analyzers. Each signal analyzer is connected with one of the power synthesizers.

In one embodiment, the first sub-testing area and the plurality of second sub-testing areas are in form of sockets. The tested RF element may be a packaged module.

In one embodiment, the signal generator is a vector signal generator; the signal analyzer is a vector signal analyzer.

According to the abovementioned objective, the present invention also proposes an RF element group testing method, which is applied to an RF element group testing system, wherein the RF element group testing system comprises a signal generator, a testing platform, and a signal analysis unit; the RF element group testing method comprises steps: using the signal generator to generate a power signal; using the testing platform to receive the power signal and transmit the power signal to a plurality of tested RF elements disposed in the testing platform; making one of the plurality of tested RF elements output a first RF signal according to the power signal; adding an identification feature to the first RF signal to generate an identification RF signal; making each one of the rest of the plurality of tested RF elements output a corresponding second RF signal according to the power signal; using the testing platform to synthesize the identification RF signal and each second RF signal to form a corresponding synthesis signal and transmit the corresponding synthesis signal to the signal analysis unit; using the signal analysis unit to resolve each synthesis signal into the identification RF signal and the corresponding second RF signal according to the identification feature; restoring the identification RF signal into the first RF signal according to the identification feature; and calculating at least one signal-feature parameter of the first RF signal and the second RF signal.

In one embodiment, the testing platform includes a power distributer, a first sub-testing area, a second sub-testing area, a phase shifter, and a power synthesizer; the plurality of tested RF elements includes a first tested RF element and a second RF element; a process from an action that the testing platform receives the power signal to an action that the testing platform generates the synthesis signal includes steps: the power distributer receives the power signal generated by the signal generator; the power distributer distributes the power signal to the first sub-testing area and the second sub-testing area; the first tested RF element, which is disposed in the first sub-testing area, outputs the first RF signal according to the power signal; the second tested RF element, which is disposed in the second sub-testing area, outputs the second RF signal according to the power signal; the phase shifter receives the first RF signal and adjusts a phase angle of the first RF signal to generate an identification RF signal, wherein the adjusted phase angle of the first RF signal is the identification feature; and the power synthesizer receives the identification RF signal and the second RF signal to generate a corresponding synthesis signal.

In one embodiment, the plurality of tested RF elements includes a first tested RF element and a plurality of second tested RF elements; the testing platform includes a power distributer, a first sub-testing area, a plurality of second sub-testing areas, a phase shifter, a power synthesizer, and a signal switcher; the first sub-testing area accommodates the first tested RF signal; each of the second sub-testing areas accommodates one of the second tested RF elements; a process from an action that the testing platform receives the power signal to an action that the testing platform generates the synthesis signal includes steps: the power distributer receives the power signal and distributes the power signal to the first sub-testing area and the plurality of second sub-testing areas; the first tested RF element outputs the first RF signal according to the power signal; the plurality of second tested RF elements respectively outputs the corresponding second RF signals according to the power signal; the phase shifter receives the first RF signal and adjusts a phase angle of the first RF signal to generate an identification RF signal and outputs the identification RF signal to the power synthesizer, wherein the adjusted phase angle of the first RF signal is the identification feature; the signal switcher performs switching to connect each of the second sub-testing areas with the signal synthesizer in sequence, and outputs the second RF signals, which are respectively output by second tested RF elements, to the power synthesizer; and the power synthesizer synthesizes the identification RF signal and each of the second RF signals to generate one corresponding synthesis signal.

Hence, the present invention can simultaneously test a plurality of tested RF elements using the signal analyzers whose number is smaller than the number of the tested RF elements. In the situation of a plurality of second tested RF elements, the identification RF signal can be respectively synthesized with different second RF signals to generate different synthesis signals as long as the signal switcher respectively connects each of the sub-testing areas to the power synthesizer. Different synthesis signals may be resolved to obtain the same first RF signal and different second RF signals, whereby to accurately calculate the signal-feature parameters of the second RF signals.

BRIEF DESCRIPTION OF THE DRAWINGS

FIG. 9 is a flowchart of a second embodiment of the RF element group testing method of the present invention.

DETAILED DESCRIPTION OF THE INVENTION

Figure 1:
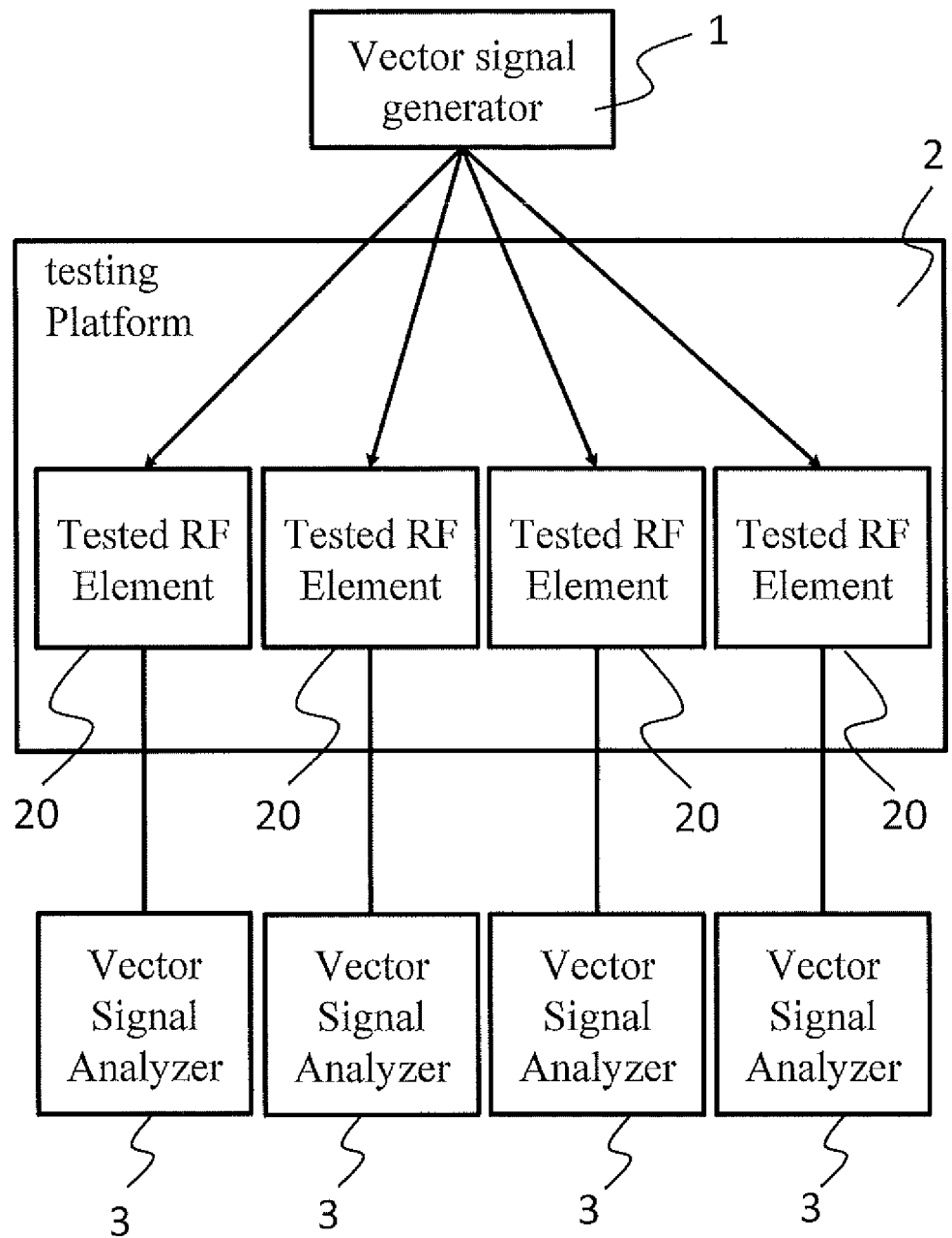
FIG. 1 is a diagram schematically showing the architecture of a conventional RF element parallel testing system.

The embodiments of the present invention will be further demonstrated in details hereinafter in cooperation with the corresponding drawings. In the drawings and the specification, the same numerals represent the same or the like elements as much as possible. For simplicity and convenient labelling, the shapes and thicknesses of the elements may be exaggerated in the drawings. It is easily understood: the elements belonging to the conventional technologies and well known by the persons skilled in the art may be not particularly depicted in the drawings or described in the specification. Various modifications and variations made by the persons skilled in the art according to the contents of the present invention are to be included by the scope of the present invention.

Figure 2:
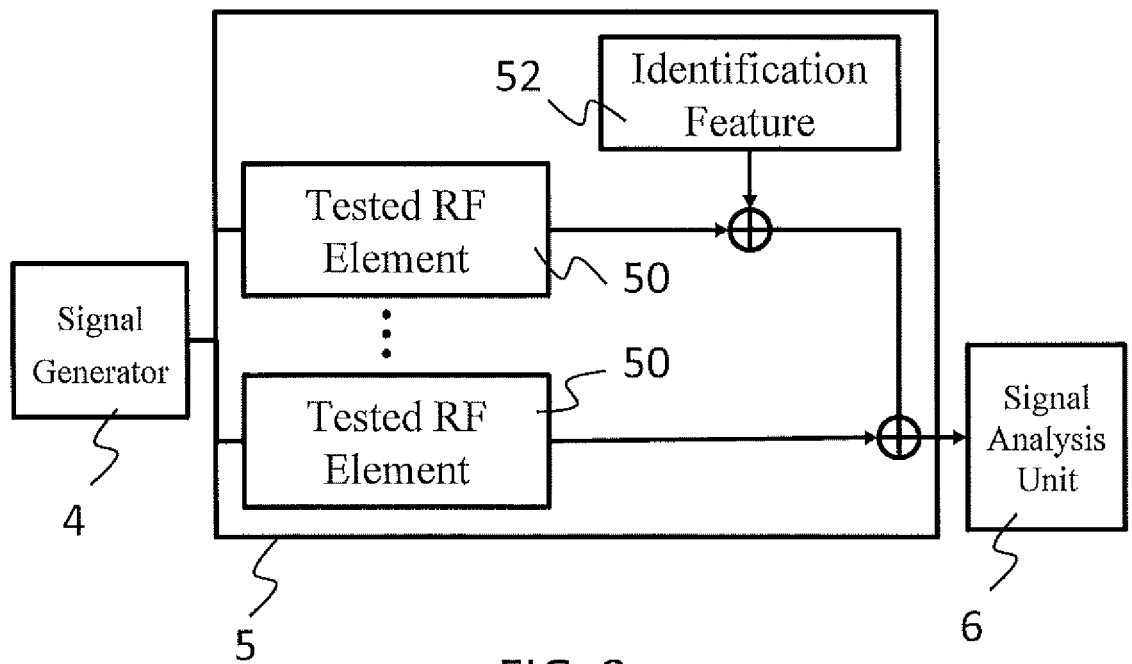
FIG. 2 is a diagram schematically showing the architecture of an RF element group testing system of the present invention.

Refer to FIG. 2. The present invention proposes an RF element group testing system, which comprises a signal generator 4, a testing platform 5, and a signal analysis unit 6. The testing platform 5 accommodates a plurality of tested RF elements 50. The testing platform 5 is connected with the signal generator 4 and the signal analysis unit 6. The signal generator 4 generates a power signal and transmits the power signal to each of the tested RF elements 50 through the testing platform 5. One of the plurality of tested RF elements 50 outputs a first RF signal. An identification feature 52 is added to the first RF signal to generate an identification RF signal. The rest of the plurality of tested RF elements 50 respectively output second RF signals. The identification RF signal is synthesized with each second RF signal to generate a corresponding synthesis signal. The signal analysis unit 6 receives each synthesis signal. The signal analysis unit 6 resolves each synthesis signal into the identification RF signal and the corresponding second RF signal according to the identification feature 52. The signal analysis unit 6 restores the identification RF signal to obtain the first RF signal according to the identification feature 52. The signal analysis unit 6 further works out at least one signal-feature parameter of the first RF signal and each of the second RF signals, wherein the signal-feature parameter may be return loss, isolation, frequency, or amplitude.

Figure 3:
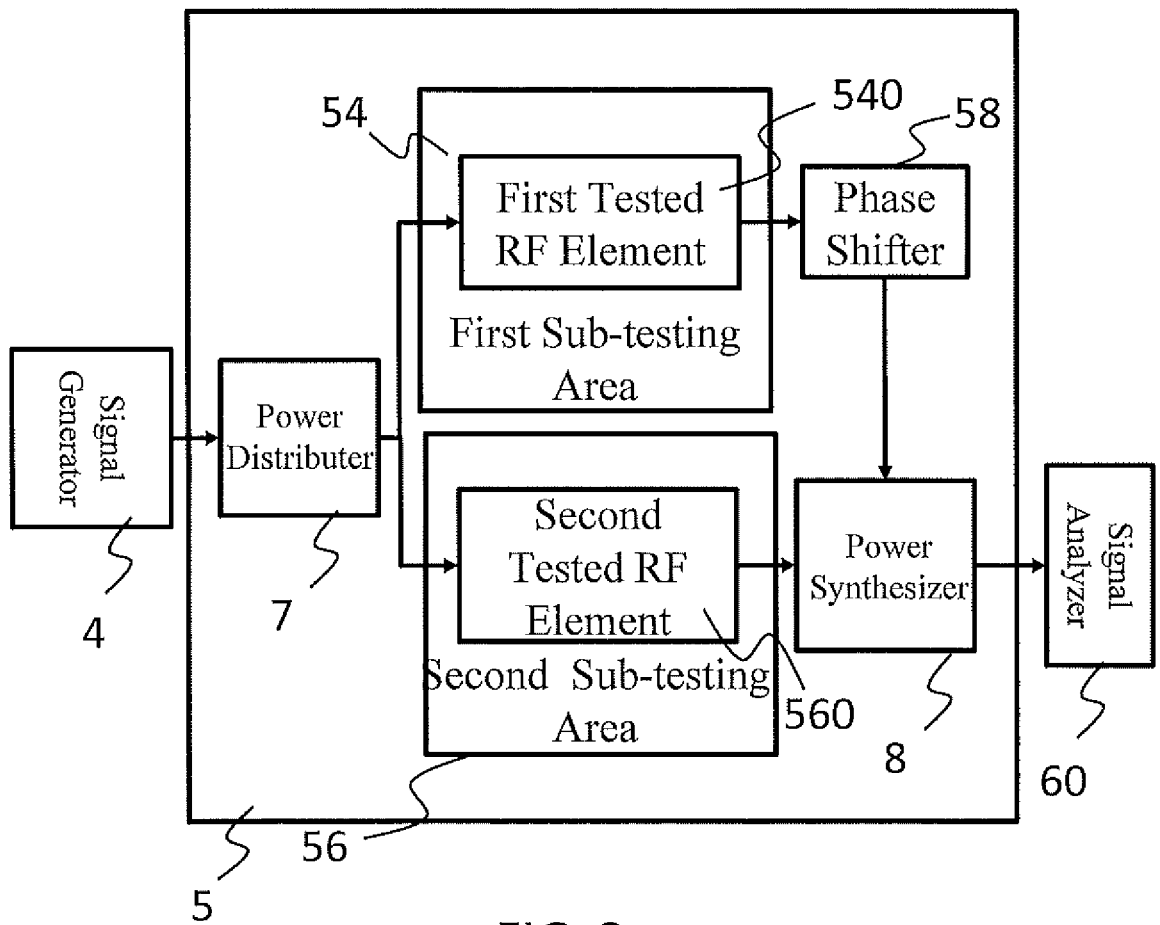
FIG. 3 is a diagram schematically showing the architecture of a first embodiment of the RF element group testing system of the present invention.

The First Embodiment of the RF Element Group Testing System of the Present Invention Refer to FIG. 3. In the first embodiment of an RF element group testing system, the plurality of tested radio-frequency elements 50 includes a first tested RF element 540 and a second tested RF element 560. The testing platform 5 includes a power distributer 7, a first sub-testing area 54, a second sub-testing area 56, a phase shifter 58, and a power synthesizer 8. The power distributer 7 is connected with the signal generator 4, the first sub-testing area 54, and the second sub-testing area 56. The phase shifter 58 is connected with the first sub-testing area 54. The power synthesizer 8 is connected with the phase shifter 58 and the second sub-testing area 56. The power distributer 7 distributes the power signal to the first sub-testing area 54 and the second sub-testing area 56, whereby to make the first tested RF element 540 placed in the first sub-testing area 54 output the first RF signal according to the power signal and make the second tested RF element 560 placed in the second sub-testing area 56 output the second RF signal according to the power signal. The phase shifter 58 receives the first RF signal and adjusts the phase angle of the first RF signal to generate the identification RF signal, wherein the adjusted phase angle of the first RF signal is the identification feature 52. The power synthesizer 8 receives the identification RF signal and the second RF signal to generate the synthesis signal. The signal analysis unit 6 is a signal analyzer 60. The signal analyzer 60 is connected with the power synthesizer 8.

Figure 4:
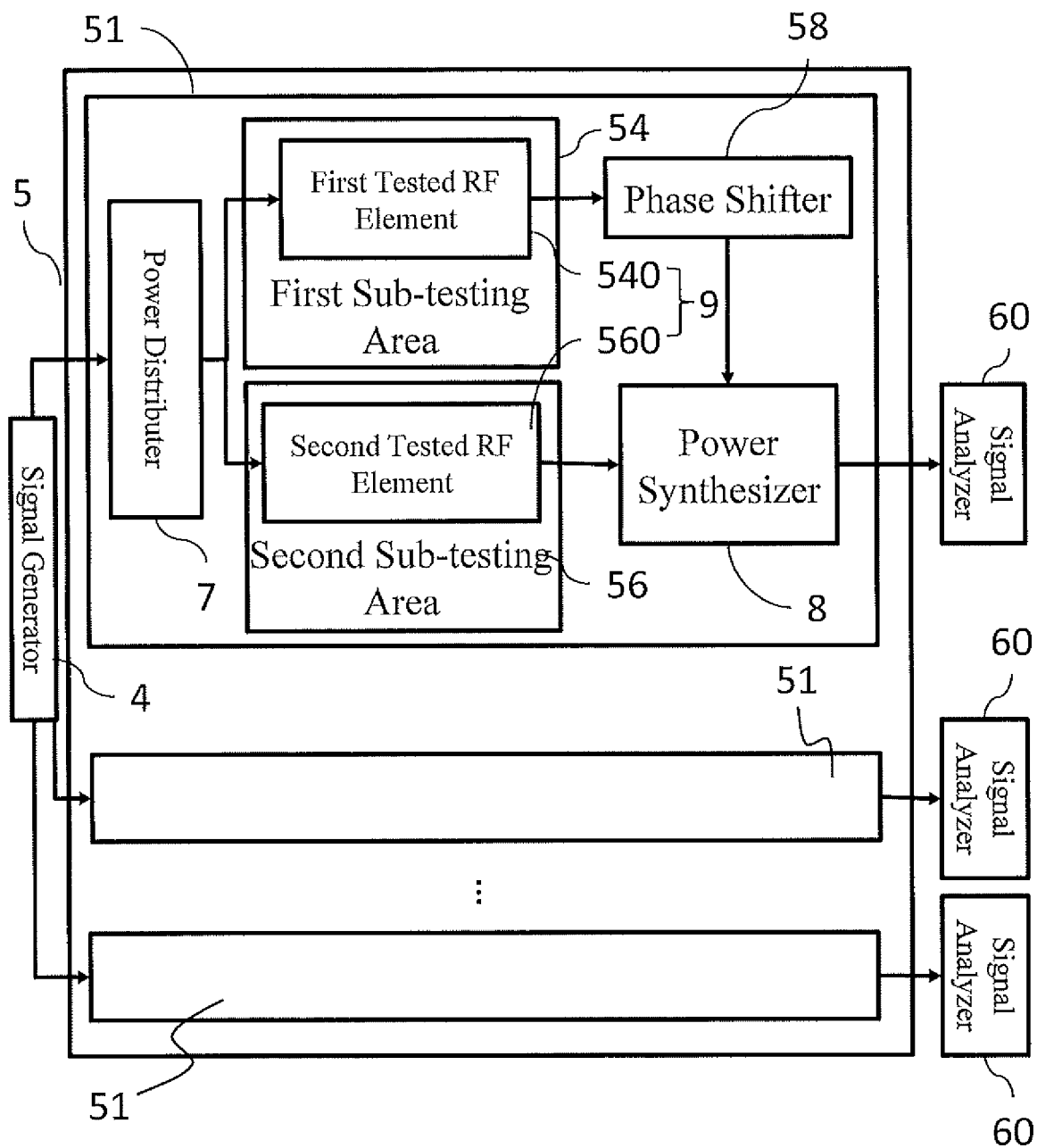
FIG. 4 is a diagram schematically showing the architecture of a second embodiment of the RF element group testing system of the present invention.

The Second Embodiment of the RF Element Group Testing System of the Present Invention Refer to FIG. 4. The second embodiment of the RF element group testing system is different from the first embodiment in that the plurality of tested RF elements 50 is divided into a plurality of tested groups 9. In the second embodiment, each tested group 9 includes a first tested RF element 540 and a second tested RF element 560. The testing platform 5 includes a power distributer 7 and a plurality of testing areas 51. The signal analysis unit 6 includes a plurality of signal analyzers 60. Each testing area 51 accommodates one of the plurality of tested groups 9. Each testing area 51 is equivalent to the combination of the first sub-testing area 54 and the second sub-testing area 56 mentioned in the first embodiment, the phase shifter 58 and the power synthesizer 8. The power synthesizer 8 of each testing area 51 is connected with one of the plurality of signal analyzer 60. Thus, each signal analyzer 60 may receive the synthesis signal of the power synthesizer 8 connected with the signal analyzer 60. Each signal analyzer 60 calculates at least one signal-feature parameter of the first RF signal and the second RF signal of the testing area 51 that the signal analyzer 60 is connected to. Each signal analyzer is connected with one of the plurality of power synthesizers 8.

Figure 5:
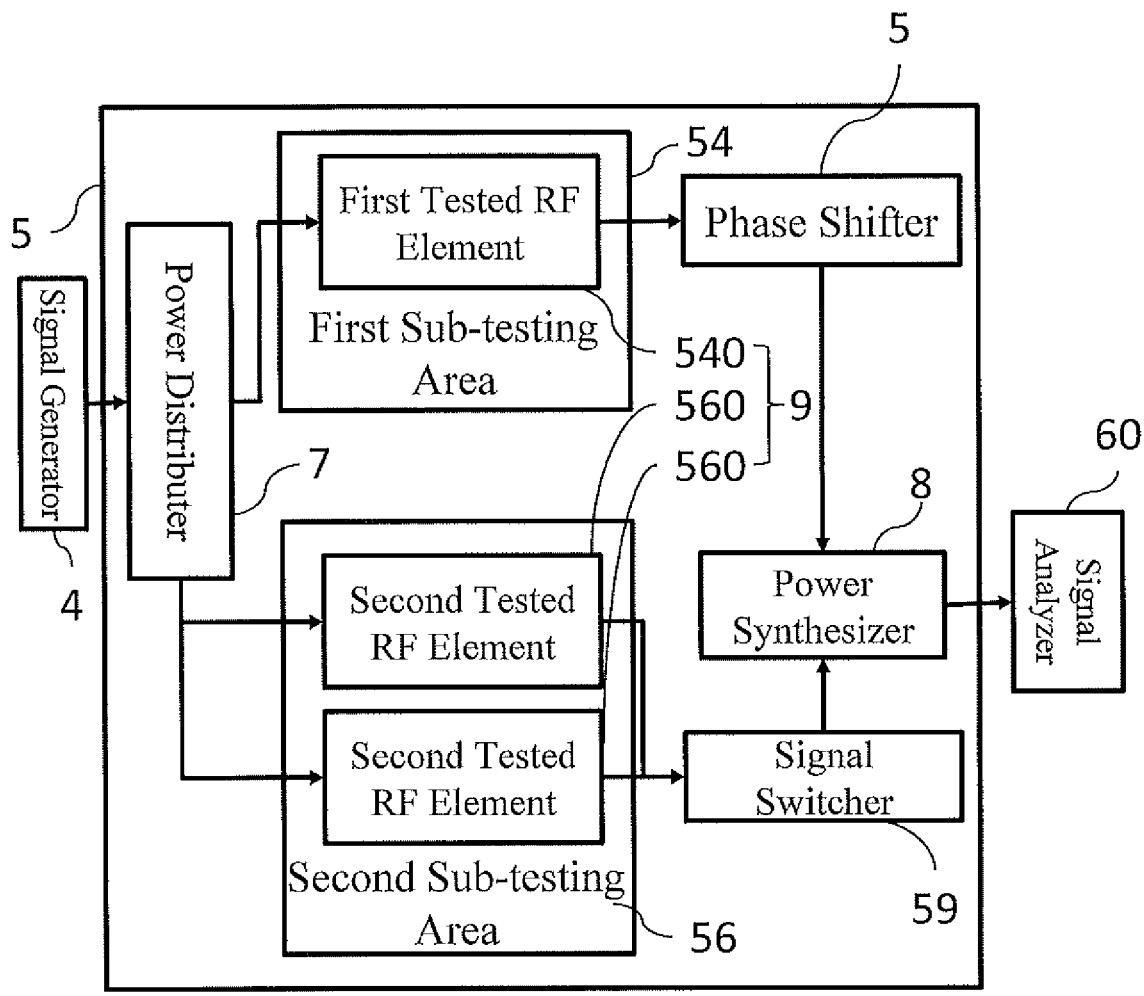
FIG. 5 is a diagram schematically showing the architecture of a third embodiment of the RF element group testing system of the present invention.

The Third Embodiment of an RF Element Group Testing System of the Present Invention Refer to FIG. 5. The third embodiment of the RF element group testing system is different from the first embodiment in that the plurality of tested RF elements 50 includes a first tested RF element 540 and a plurality of second tested RF elements 560. In the third embodiment, the testing platform 5 includes a power distributer 7, a first sub-testing area 54, a plurality of second sub-testing areas 56, a phase shifter 58, a power synthesizer 8, and a signal switcher 59. The power distributer 7 is connected with the signal generator 4, the first sub-testing area 54, and the plurality of second sub-testing area 56. The phase shifter 58 is connected with the first sub-testing area 54. The plurality of second sub-testing areas 56 is connected with the signal switcher 59. The power synthesizer 8 is connected with the phase shifter 58 and the signal switcher 59. The power distributer 7 distributes the power signal to the first sub-testing area 54 and the plurality of second sub-testing areas 56, whereby to make the first tested RF element 540, which is accommodated by the first sub-testing area 54, generates the first RF signal according to the power signal and make the plurality of second tested RF elements 56, which is respectively accommodated by the second sub-testing areas 56, separately generate the second RF signals according to the power signal. The phase shifter 58 receives the first RF signal and adjusts the phase angle of the first RF signal to generate the identification RF signal and then transmits the identification RF signal to the power synthesizer 8, wherein the adjusted phase angle of the first RF signal is exactly the identification feature 52. The signal switcher 59 performs switching to connect each of the second sub-testing areas 56 to the power synthesizer 8 in sequence and outputs the second RF signal of the second sub-testing area 56, which is connected to the signal switcher 59 in a cycle of switching, to the power synthesizer 8. In other words, the signal switcher 59 is configured to perform switching one by one in the plurality of second sub-testing areas 56 so as to be in signal connection with one second sub-testing area 56 each time and output the second RF signal of the sub-testing area 56, which is connected with the signal switcher 59 at the moment. The power synthesizer 8 synthesizes the identification RF signal and each second RF signal to form one corresponding synthesis signal. The signal analysis unit 6 is a signal analyzer 60. The signal analyzer 60 is connected with the power synthesizer 8. In the third embodiment, the signal analyzer 60 works out at least one signal-feature parameter of the first RF signal and the second RF signal of the sub-testing areas 51, which the signal analyzer 60 is connected to.

Figure 6:
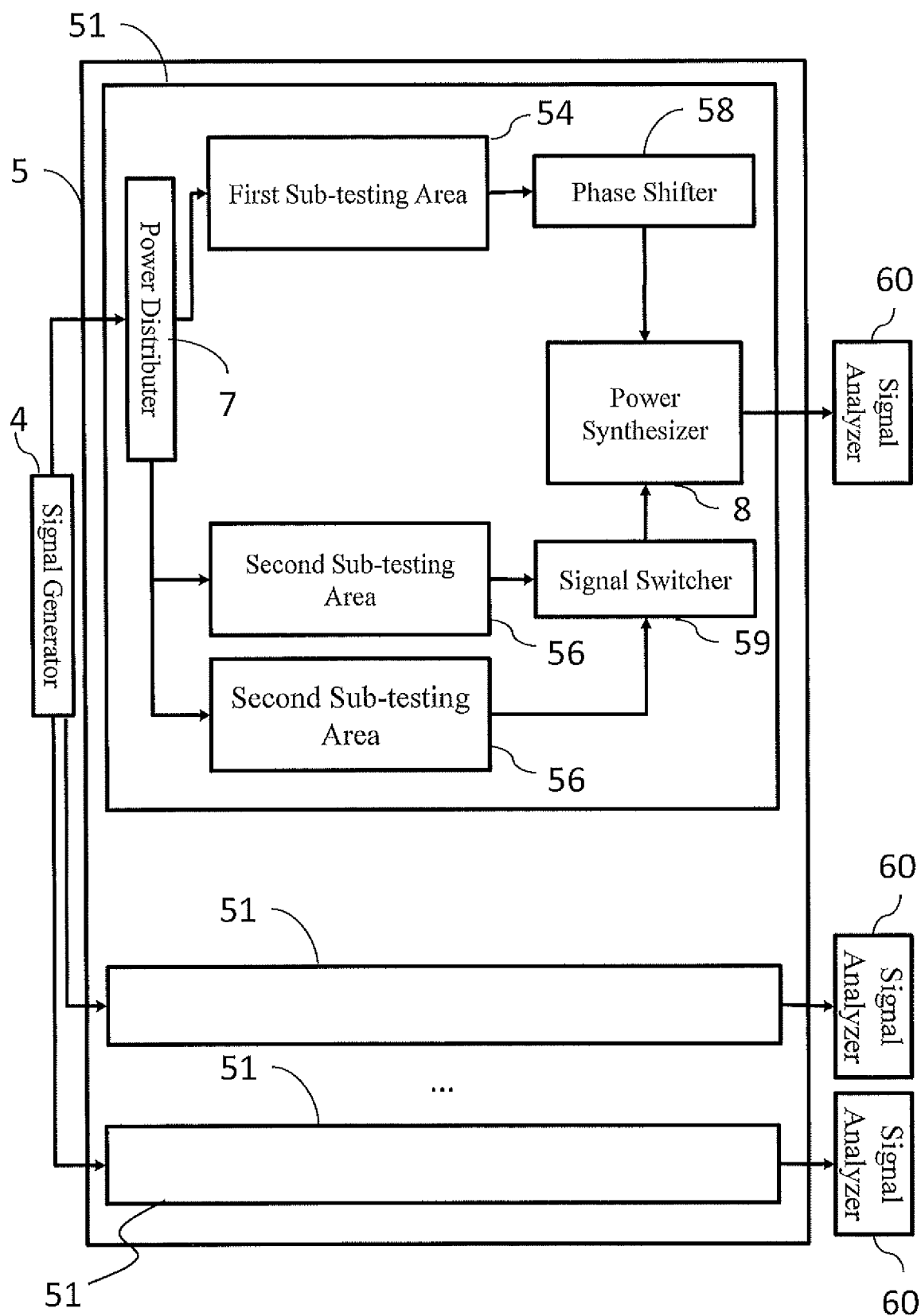
FIG. 6 is a diagram schematically showing the architecture of a fourth embodiment of the RF element group testing system of the present invention.

Fourth Embodiment of the RF Element Group Testing System of the Present Invention Refer to FIG. 6. The fourth embodiment of the RF element group testing system is different from the third embodiment in that the plurality of tested RF elements 50 is divided into a plurality of tested groups 9. Each tested group 9 includes a first tested RF element 540 and a plurality of second tested RF elements 560. The testing platform 5 includes a power distributer 7 and a plurality of testing areas 51. The signal analysis unit 6 includes a plurality of signal analyzers 60. Each testing area 51 is equivalent to the combination of the first sub-testing area 54 and the plurality of second sub-testing areas 56 mentioned in the third embodiment, the phase shifter 58, the signal switcher 59, and the power synthesizer 8. The power synthesizer 8 of each testing area 51 is connected with one of the plurality of signal analyzers 60. Thus, each signal analyzer 60 may receive the corresponding synthesis signal of the power synthesizer 8 that the signal analyzer 60 is connected with. Further, each signal analyzer 60 calculates at least one signal-feature parameter of the first RF signal and the plurality of second RF signals of the testing area 51 that the signal analyzer 60 is connected with.

In the conventional RF element parallel testing system, each vector signal analyzer can only be connected with a single tested RF element 50 and can only calculate at least one signal-feature parameter of a single tested RF element 50. It is learned from the above description: in the RF element group testing system of the present invention, each signal analyzer 60 at least can calculate a first RF signal and a second RF signal and may further calculate a first RF signal and a plurality of second RF signals. Therefore, the present invention can save a lot of money. Further, the time spent by the present invention in testing is almost the same as the time spent by the conventional RF element parallel testing system.

Figure 7:
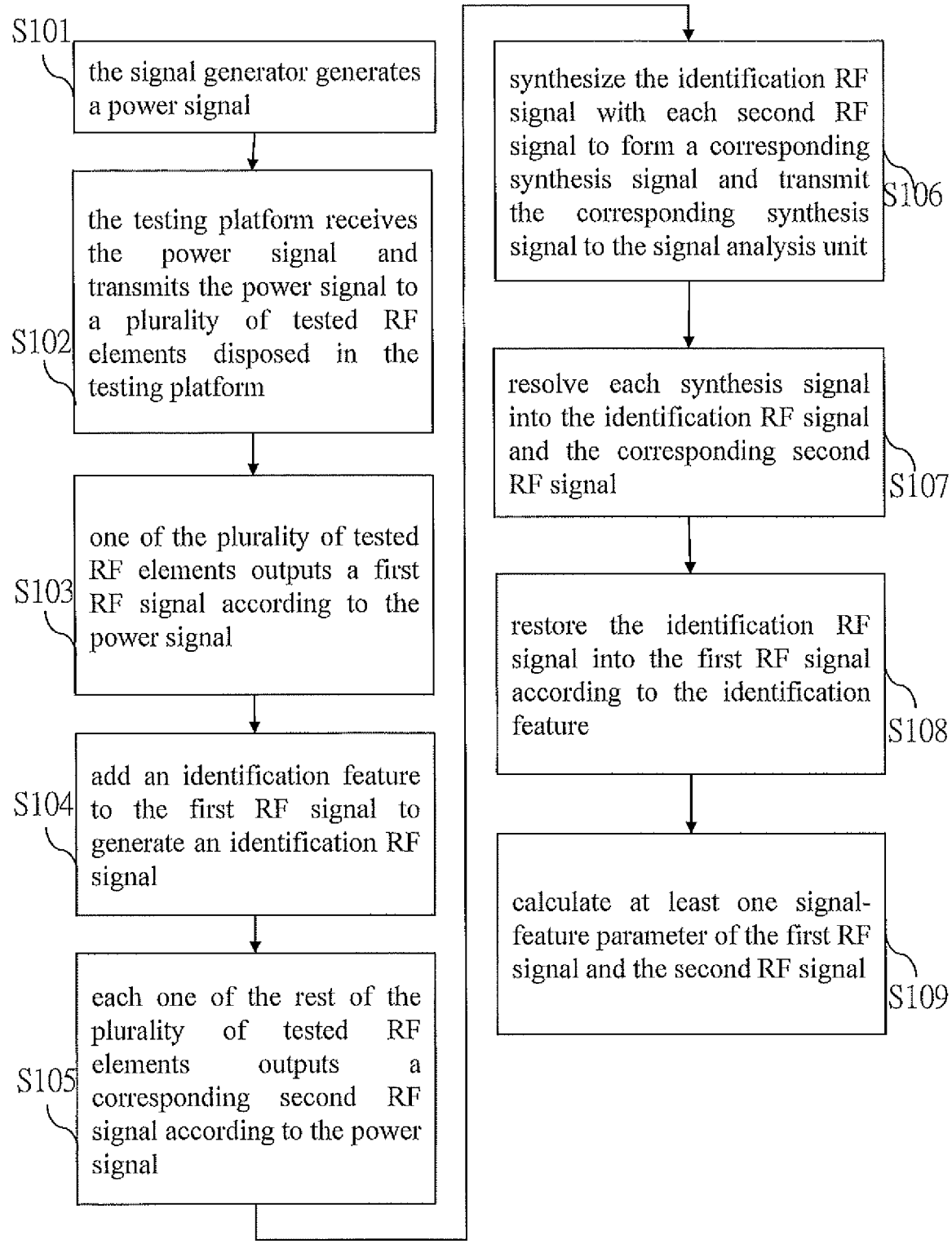
FIG. 7 is a flowchart of an RF element group testing method of the present invention.

Refer to FIG. 7. The present invention also proposes an RF element group testing method, which is applied to an RF element group testing system. The RF element group testing system comprises a signal generator 4, a testing platform 5, and a signal analysis unit 6. The RF element group testing method comprises Step S101: using the signal generator 4 to generate a power signal;

Step S102: using the testing platform 5 to receive the power signal and transmit the power signal to a plurality of tested RF elements 50 disposed in the testing platform 5;

Step S103: making one of the plurality of tested RF elements output a first RF signal according to the power signal;

Step S104: adding an identification feature 52 to the first RF signal to generate an identification RF signal;

Step S105: making each one of the rest of the plurality of tested RF elements output a corresponding second RF signal according to the power signal;

Step S106: using the testing platform 5 to synthesize the identification RF signal and each second RF signal to form a corresponding synthesis signal and transmit the corresponding synthesis signal to the signal analysis unit 6;

Step S107: using the signal analysis unit 6 to resolve each synthesis signal into the identification RF signal and the corresponding second RF signal according to the identification feature 52;

Step S108: using the signal analysis unit 6 to restore the identification RF signal into the first RF signal according to the identification feature 52;

Step S109: using the signal analysis unit 6 to calculate at least one signal-feature parameter of the first RF signal and the second RF signal.

Figure 8:
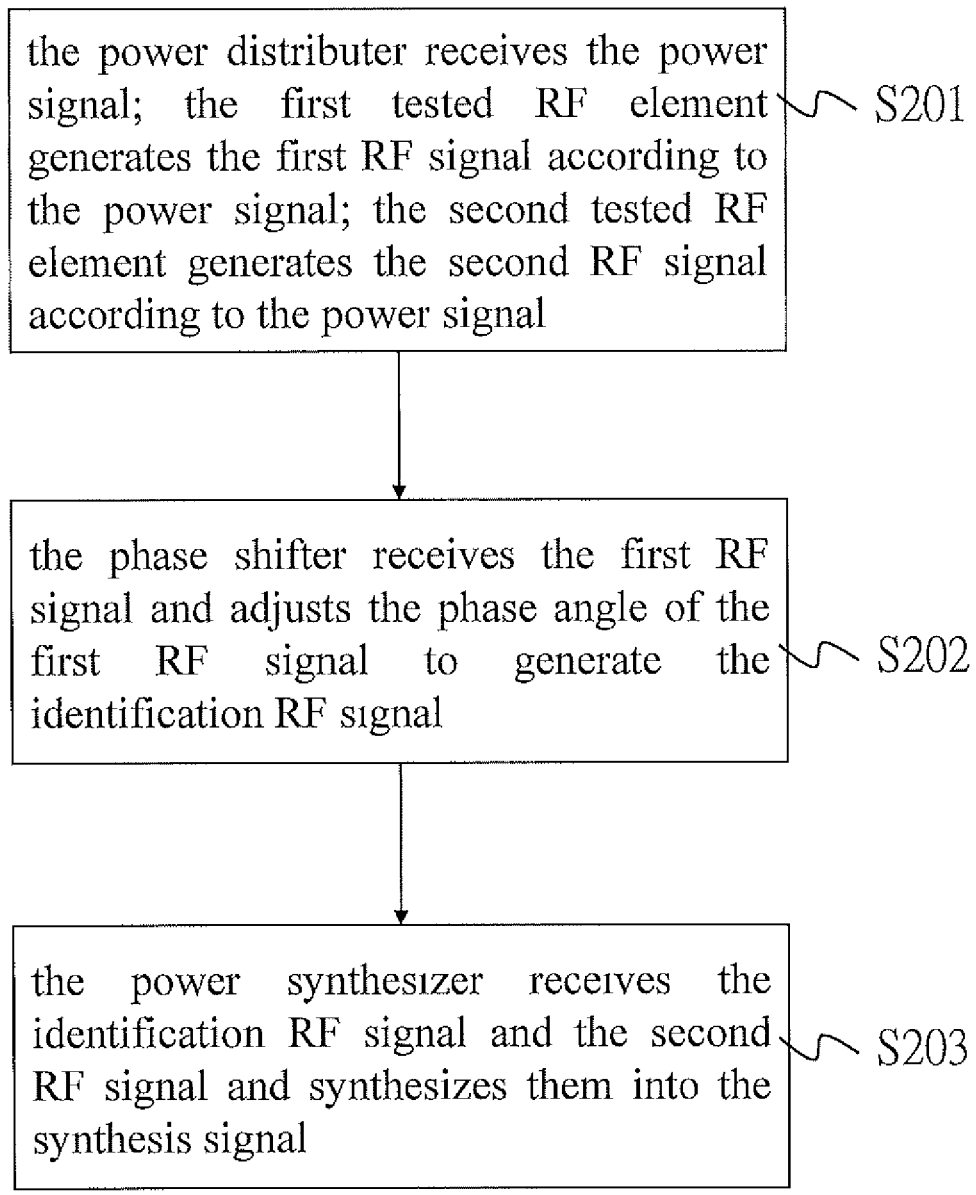
FIG. 8 is a flowchart of a first embodiment of the RF element group testing method of the present invention.

The First Embodiment of the RF Element Group Testing Method of the Present Invention Refer to FIG. 8. In the first embodiment of the RF element group testing method, the plurality of tested RF elements 50 includes a first tested RF element 540 and a second RF element 560; the testing platform 5 includes a power distributer 7, a first sub-testing area 54, a second sub-testing area 56, a phase shifter 58, and a power synthesizer 8. The first tested RF element 540 is disposed in the first sub-testing area 54; the second tested RF element 560 is disposed in the second sub-testing area 56. In the first embodiment of the RF element group testing method, the process from the action that the testing platform 5 receives the power signal to the action that the testing platform 5 generates the synthesis signal includes Steps S201-S203.

In Step S201, the power distributer 7 receives the power signal generated by the signal generator 4; the power distributer 7 distributes the power signal to the first sub-testing area 54 and the second sub-testing area 56; the first tested RF element 540, which is disposed in the first sub-testing area 54, outputs a first RF signal according to the power signal; the second tested RF element 560, which is disposed in the second sub-testing area 56, outputs a second RF signal according to the power signal.

In Step S202, the phase shifter 58 receives the first RF signal and adjusts the phase angle of the first RF signal to generate an identification RF signal, wherein the adjusted phase angle of the first RF signal is exactly the identification feature 52.

In Step S203, the power synthesizer 8 receives the identification RF signal and the second RF signal to generate a synthesis signal.

The Second Embodiment of the RF Element Group Testing Method of the Present Invention Refer to FIG. 9. In the second embodiment of the RF element group testing method, the plurality of tested RF elements 50 includes a first tested EF element 540 and a plurality of second RF elements 560; the testing platform 5 includes a power distributer 7, a first sub-testing area 54, a plurality of second sub-testing areas 56, a phase shifter 58, a power synthesizer 8, and a signal switcher 59. The first tested RF element 540 is disposed in the first sub-testing area 54; each of the second tested RF elements 560 is disposed in one of the second sub-testing areas 56. In the second embodiment of the RF element group testing method, the process from the action that the testing platform 5 receives the power signal to the action that the testing platform 5 generates the synthesis signal includes Steps S301-S304.

In Step S301, the power distributer 7 receives the power signal and distributes the power signal to the first sub-testing area 54 and the plurality of second sub-testing areas 56; the first tested RF element 540, which is disposed in the first sub-testing area 54, outputs a first RF signal according to the power signal; the second tested RF elements 560, which are disposed in the second sub-testing areas 56, respectively output corresponding second RF signals.

In Step S302, the phase shifter 58 receives the first RF signal and adjusts the phase angle of the first RF signal to generate an identification RF signal and then outputs the identification RF signal to the power synthesizer 8, wherein the adjusted phase angle of the first RF signal is exactly the identification feature 52.

In Step S303, the signal switcher 59 performs switching activities to connect each of the second sub-testing areas 56 with the power synthesizer 8 one by one so as to respectively transmit the second RF signals, which are output by the second RF elements 569, to the power synthesizer 8.

In Step S304, the power synthesizer 8 synthesizes the identification RF signal and each second RF signal to form a corresponding synthesis signal.

In one embodiment, the first sub-testing area 54 and the plurality of second sub-testing areas 56 are in form of sockets, and the tested RF elements may be packaged antenna modules.

In one embodiment, the signal generator 4 may be a vector signal generator, and the signal analyzer 60 may be a vector signal analyzer.

Below is introduced how the signal analyzer 60 resolves the synthesis signal. Suppose that the signal generator 4 generates an exciting signal I(t). The power distributer 7 provides the exciting signal I(t) to n pieces of RF paths, i.e. the paths from the power distributer 7 to the tested RF elements. The RF signal of the nth RF path is expressed as $I_n(t)$. Therefore, $$I(t) = \sum_{n=1}^{N} I_n(t),$$

wherein t is time, and N is the total number of the tested RF elements. The signal response generated by the control IC and the tested RF element 50 in the nth path is expressed as $Q_n(t)=S_n(t)R_n(t)$, wherein $S_n(t)$ is the signal response generated by the nth phase shifter, and $R_n(t)$ is the signal responsel generated by the nth tested RF element 50. The present invention is free of the control IC. Therefore, $S_n(t)=1$, or there is only signal variation in the transmission line. In the nth RF path, the tested RF element 50 receives $I_n(t)$ and outputs a signal $I_n(t)Q_n(t)$. The signal synthesizer 8 generates the sum of the signal $I_n(t)Q_n(t)$, which may be expressed by Equation (1):

$$V_{tot}(t) = \sum_{n=1}^{N} I_n(t)Q_n(t) \tag{1}$$

It is indicated by Equation (1): the RF signal is output through the reaction of the RF circuit and the tested RF element 50, the tested RF element 50 outputs the RF signal after the reaction, wherein the RF signal is generated by the RF circuit and the power synthesizer 8. The spectrum analyzer and the RF network may be used to learn the features of the tested RF elements and the information of $I_n(t)Q_n(t)$ required by calibration. As $I_n(t)$ is unknown, $Q_n(t)$ is especially important. Equation (1) may be used to solve $I_n(t)Q_n(t)$. If $S_n(t)$ is the phase angle adjusted by the phase shifter 58, etc., $I_n(t)R_n(t)$ may be acquired. Thus, Equation (2) may be obtained according to Equation (1).

$$V_{tot}(t) = \sum_{n=1}^{N} S_n(t)[I_n(t)R_n(t)] \tag{2}$$

Equation (2) includes n pieces of unknown functions. N pieces of signals are required to solve n pieces of $[I_n(t)R_n(t)]$. Therefore, we should focus on the technology to generate $S_n(t)$ and the hardware to realize $S_n(t)$.

[1] Suppose that $S_n(t)=\delta(t-t_n)$, wherein $\delta(\ )$ is a pulse function, and $t_n$ expresses the nth time point. Thus Equation (3) is obtained.

$$V_{tot}(t_{n-1} < t < t_n) = I_n(t)R_n(t) \tag{3}$$

[2] Suppose that $S_n(t)$ generates orthogonal signals. Thus, the inner products of the signal functions may be used to obtain solutions, as shown by Equation (4).

$$[I_n(t)R_n(t)](S_n(t),S_n(t)) = (V_{tot}(t),S_n(t)) \tag{4}$$

[3] Suppose that the signals of $S_n(t)$ are non-orthogonal. Thus, Equation (4) generates a set of linear equations. Then, the set of linear equations are solved to obtain $[I_n(t)R_n(t)]$.

[4] Suppose that the inner RF device of the tested RF elements 50 is accessible. Thus, $Rn(t)=1$, and $S_n(t)=R'_n(t)S'_n(t)$, wherein $R'_n(t)$ is the response of the controllable devices of the tested RF elements 50.

In conclusion, the present invention can perform the testing of a plurality of tested RF elements simultaneously, wherein the number of the signal analyzers is smaller than the number of the tested RF elements. In the case of a plurality of second tested RF elements, the signal switcher 9 performs switching activities to connect each of the second RF elements with the power synthesizer in sequence, whereby the identification RF signal may be synthesized with different second RF signals to generate different synthesis signals. The different synthesis signals may be resolved to obtain the same first RF signal and different second RF signals. Thereby, the signal-feature parameters of the second RF signals may be accurately worked out.

The embodiments described above are only to exemplify the present invention but not to limit the scope of the present invention. Equivalent modifications or variations of these embodiments may be made by the persons skilled in the art without departing from the scope of the present invention and would be included by the scope of the present invention.

What is claimed is:

1. A radio-frequency (RF) element group testing system, comprising
    a signal generator, generating a power signal;
    a testing unit, including
        a testing platform, connected with the signal generator, accommodating a plurality of tested RF elements, and transmitting the power signal to each of the plurality of tested RF elements, wherein one of the plurality of tested RF elements outputs a first RF signal; an identification feature is added to the first RF signal to generate an identification RF signal; the rest of the plurality of tested RF elements respectively output second RF signals; the testing platform synthesizes the identification RF signal and each of the second RF signals to generate a corresponding synthesis signal; and
    a signal analysis unit, connected with the testing unit, resolving each synthesis signal into the identification RF signal and one corresponding second RF signal according to the identification feature, restoring the identification RF signal to obtain the first RF signal according to the identification feature, and working out at least one signal-feature parameter of the first RF signal and each of the second RF signals.

2. The RF element group testing system according to claim 1, wherein the plurality of tested RF elements includes a first tested RF element and a second tested RF element; the testing platform includes
    a power distributer, connected with the signal generator, and receiving the power signal;
    a first sub-testing area, connected with the power distributer, and accommodating the first tested RF element, wherein the first tested RF element outputs the first RF signal according to the power signal;
    a second sub-testing area, connected with the power distributer, and accommodating the second tested RF element, wherein the second tested RF element outputs the second RF signal according to the power signal;
    a phase shifter, connected with the first sub-testing area, receiving the first RF signal, and adjusting a phase angle of the first RF signal to generate the identification RF signal, wherein the adjusted phase angle of the first RF signal is the identification feature; and
    a power synthesizer, connected with the second sub-testing area and the phase shifter, and receiving the identification RF signal and the second RF signal to generate the synthesis signal,
    the signal analysis unit is a signal analyzer connected with the power synthesizer.

3. The RF element group testing system according to claim 1, wherein the plurality of tested RF elements is divided into a plurality of tested groups; each of the plurality of tested groups includes a first tested RF element and a second tested RF element; the testing platform includes a power distributer and a plurality of testing areas; each of the plurality of testing areas accommodates one of the plurality of tested groups; the power distributer is connected with the signal generator and receives the power signal; each of the testing areas includes
    a first sub-testing area, connected with the power distributer, accommodating the first tested RF element, wherein the first tested RF element outputs the first RF signal according to the power signal;
    a second sub-testing area, connected with the power distributer, accommodating the second RF element, wherein the second RF element outputs the second RF signal according to the power signal;
    a phase shifter, connected with the first sub-testing area, receiving the first RF signal, adjusting a phase angle of the first RF signal to generate the identification RF signal, wherein the adjusted phase angle of the first RF signal is the identification feature; and
    a power synthesizer, connected with the second sub-testing area and the phase shifter, receiving the identification RF signal and the second RF signal, and performing synthesis to generate one corresponding synthesis signal;
    the signal analysis unit includes a plurality of signal analyzers; each of the signal analyzers is connected with one of the power synthesizers.

4. The RF element group testing system according to claim 1, wherein the plurality of tested RF elements includes a first tested RF element and a plurality of second RF tested elements; the testing platform includes
    a power distributer, connected with the signal generator, and receiving the power signal;
    a first sub-testing area, connected with the power distributer, and accommodating the first tested RF element, wherein the first tested RF element outputs the first RF signal according to the power signal;
    a plurality of second sub-testing areas, connected with the power distributer, each accommodating one of the plurality of second tested RF elements, wherein each of the second tested RF elements outputs one corresponding second RF signal according to the power signal;
    a phase shifter, connected with the first sub-testing area, receiving the first RF signal, adjusting a phase angle of the first RF signal to generate the identification RF signal, wherein the adjusted phase angle of the first RF signal is the identification feature;
    a signal switcher, performing switching to be in signal connection with each of the second sub-testing areas in sequence, outputting the second RF signal of the second sub-testing area connected with the signal switcher; and
    a power synthesizer, connected with the phase shifter and the signal switcher, synthesizing the identification RF signal and one of the second RF signals to generate one corresponding synthesis signal;
    the signal analysis unit is a signal analyzer connected with the power synthesizer.

5. The RF element group testing system according to claim 1, wherein the plurality of tested RF elements is divided into a plurality of tested groups; each of the plurality of tested groups includes a first tested RF element and a plurality of second tested RF elements; the testing platform includes a plurality of power distributers and a plurality of testing areas; each of the plurality of testing areas accommodates one of the plurality of tested groups; the power distributer is connected with the signal generator and receives the power signal; each of the testing areas includes
    a power distributer, connected with the signal generator, and receiving the power signal;

a first sub-testing area, connected with the power distributer, and accommodating the first tested RF element, wherein the first tested RF element outputs the first RF signal according to the power signal;

a plurality of second sub-testing areas, connected with the power distributer, each accommodating one of the plurality of second tested RF elements, wherein each of the second tested RF elements outputs one corresponding second RF signal according to the power signal;

a phase shifter, connected with the first sub-testing area, receiving the first RF signal, adjusting a phase angle of the first RF signal to generate the identification RF signal, wherein the adjusted phase angle of the first RF signal is the identification feature;

a signal switcher, performing switching in the plurality of second sub-testing areas to be in signal connection with each of the second sub-testing areas in sequence, and outputting the second RF signal of the second sub-testing area connected with the signal switcher; and a power synthesizer, connected with the phase shifter and the signal switcher, synthesizing the identification RF signal and one of the second RF signals to form one corresponding synthesis signal;

the signal analysis unit includes a plurality of signal analyzers; each of the signal analyzers is connected with one of the power synthesizers.

6. An RF element group testing method, which is applied to an RF element group testing system, wherein the RF element group testing system comprises a signal generator, a testing platform, and a signal analysis unit; the RF element group testing method comprises steps:

using the signal generator to generate a power signal;

using the testing platform to receive the power signal and transmit the power signal to a plurality of tested RF elements disposed in the testing platform;

making one of the plurality of tested RF elements output a first RF signal according to the power signal;

adding an identification feature to the first RF signal to generate an identification RF signal;

making each one of the rest of the plurality of tested RF elements output a corresponding second RF signal according to the power signal;

using the testing platform to synthesize the identification RF signal and each second RF signal to form a corresponding synthesis signal and transmit the corresponding synthesis signal to the signal analysis unit;

using the signal analysis unit to resolve each synthesis signal into the identification RF signal and the corresponding second RF signal according to the identification feature;

restoring the identification RF signal into the first RF signal according to the identification feature; and calculating at least one signal-feature parameter of the first RF signal and the second RF signal.

7. The RF element group testing method according to claim 6, wherein the testing platform includes a power distributer, a first sub-testing area, a second sub-testing area, a phase shifter, and a power synthesizer; the plurality of tested RF elements includes a first tested RF element and a second RF element; the first sub-testing area accommodates the first tested RF element; the second sub-testing area accommodates the second RF tested element; a process from an action that the testing platform receives the power signal to an action that the testing platform generates the synthesis signal includes steps:

the power distributer receives the power signal generated by the signal generator;

the power distributer distributes the power signal to the first sub-testing area and the second sub-testing area; the first tested RF element, which is disposed in the first sub-testing area, outputs the first RF signal according to the power signal; the second tested RF element, which is disposed in the second sub-testing area, outputs the second RF signal according to the power signal;

the phase shifter receives the first RF signal and adjusts a phase angle of the first RF signal to generate an identification RF signal, wherein the adjusted phase angle of the first RF signal is the identification feature; and the power synthesizer receives the identification RF signal and the second RF signal to generate a synthesis signal.

8. The RF element group testing method according to claim 6, wherein the plurality of tested RF elements includes a first tested RF element and a plurality of second tested RF elements; the testing platform includes a power distributer, a first sub-testing area, a plurality of second sub-testing areas, a phase shifter, a power synthesizer, and a signal switcher; the first sub-testing area accommodates the first tested RF signal; each of the second sub-testing areas accommodates one of the second tested RF elements; a process from an action that the testing platform receives the power signal to an action that the testing platform generates the synthesis signal includes steps:

the power distributer receives the power signal and distributes the power signal to the first sub-testing area and the plurality of second sub-testing areas; the first tested RF element outputs the first RF signal according to the power signal; the plurality of second tested RF elements respectively outputs corresponding second RF signals according to the power signal;

the phase shifter receives the first RF signal and adjusts a phase angle of the first RF signal to generate an identification RF signal and outputs the identification RF signal to the power synthesizer, wherein the adjusted phase angle of the first RF signal is the identification feature;

the signal switcher performs switching to connect each of the second sub-testing areas with the signal synthesizer in sequence, and outputs the second RF signals, which are respectively output by second tested RF elements, to the power synthesizer; and the power synthesizer synthesizes the identification RF signal and each of the second RF signals to generate one corresponding synthesis signal.

* * * * *